United States Patent
Pignolo

(10) Patent No.: US 9,490,776 B2
(45) Date of Patent: Nov. 8, 2016

(54) LOAD TRANSIENT ASYNCHRONOUS BOOST FOR PULSE WIDTH MODULATION MODULATOR

(71) Applicant: ST-Ericsson SA, Plan-les-Ouates (CH)

(72) Inventor: Philippe Pignolo, Crolles (FR)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/438,727

(22) PCT Filed: Nov. 15, 2013

(86) PCT No.: PCT/EP2013/073923
§ 371 (c)(1),
(2) Date: Apr. 27, 2015

(87) PCT Pub. No.: WO2014/076229
PCT Pub. Date: May 22, 2014

(65) Prior Publication Data
US 2015/0256159 A1    Sep. 10, 2015

(30) Foreign Application Priority Data

Nov. 19, 2012  (EP) .................................... 12306439
Oct. 28, 2013  (EP) .................................... 13368041

(51) Int. Cl.
*H03K 3/017*  (2006.01)
*H02M 3/156*  (2006.01)
*H03K 3/012*  (2006.01)

(52) U.S. Cl.
CPC ............. *H03K 3/017* (2013.01); *H02M 3/156* (2013.01); *H03K 3/012* (2013.01); *H02M 2003/1566* (2013.01)

(58) Field of Classification Search
CPC ............................... H03K 3/017; H03K 3/012
USPC ........................................... 323/282; 332/110
See application file for complete search history.

(56) References Cited

U.S. PATENT DOCUMENTS

| | | | |
|---|---|---|---|
| 2006/0055387 A1 | 3/2006 | Steele | |
| 2006/0055388 A1 | 3/2006 | Tang et al. | |
| 2010/0043757 A1* | 2/2010 | Bolz | F02D 41/20 123/476 |
| 2011/0006745 A1* | 1/2011 | Saphon | H02M 3/156 323/282 |
| 2011/0304307 A1* | 12/2011 | Shieh | H02M 3/1588 323/282 |
| 2012/0013322 A1 | 1/2012 | Dearborn | |
| 2012/0105035 A1* | 5/2012 | Lee | H02M 3/1588 323/282 |

OTHER PUBLICATIONS

International Search Report issued in corresponding International application No. PCT/EP2013/073923, date of mailing of report Apr. 1, 2014.

* cited by examiner

*Primary Examiner* — Jeffrey Shin
(74) *Attorney, Agent, or Firm* — Patent Portfolio Builders PLLC

(57) ABSTRACT

A pulse width modulation controller (PWM) is disclosed which has a MOSFET (15) responsive to the error voltage (Verror) signal from the PWM amplifier (17) to detect a transient condition without delay ΔTd. The MOSFET drain generates and applies a detection signal (S) to a delaying circuit (D). The delaying circuit (D) is responsive to the transient detection signal (S) to asynchronously output two latch signals (S1) and (S2) which on application to respective latch circuits (L1, L2) cause a change in conduction state of PMOS (8) and NMOS (9). This arrangement reduces voltage undershoot.

8 Claims, 8 Drawing Sheets

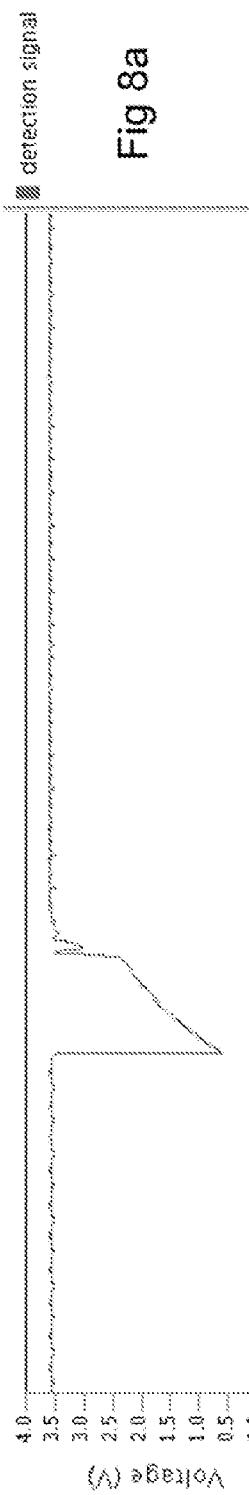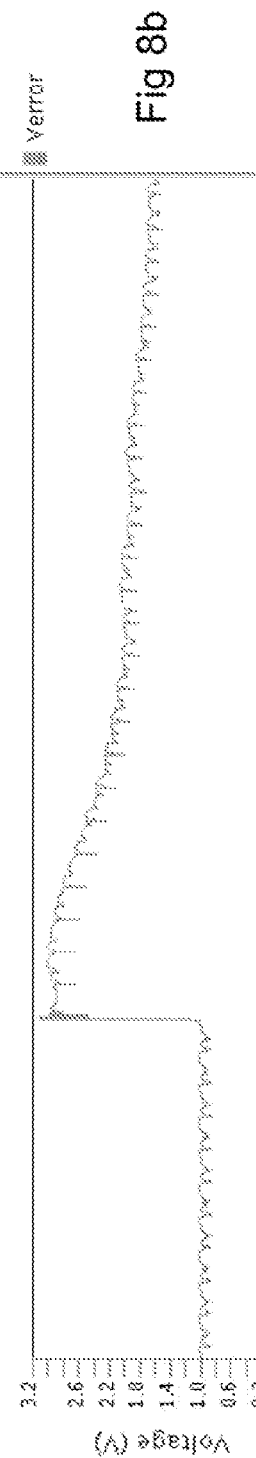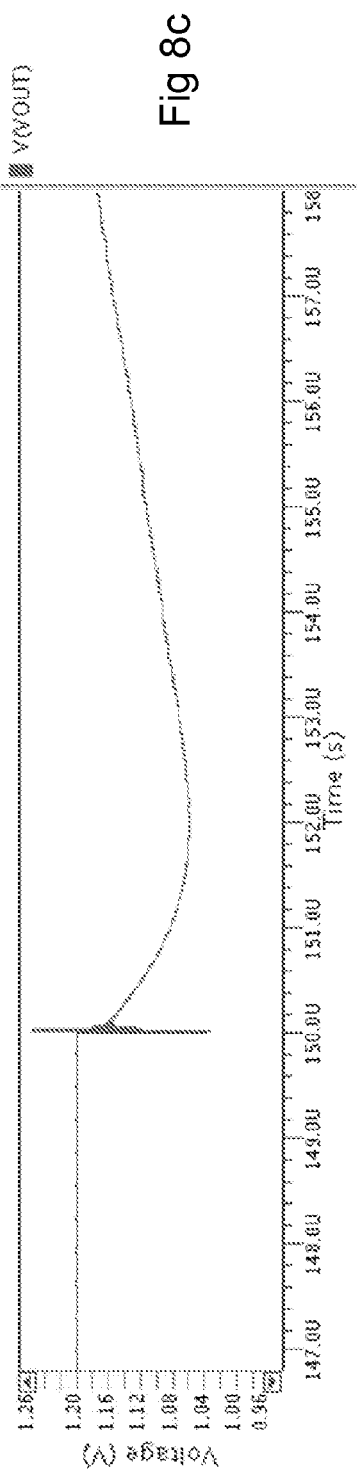

LOAD TRANSIENT ASYNCHRONOUS BOOST FOR PULSE WIDTH MODULATION MODULATOR

FIELD OF THE INVENTION

The invention relates to the field of power management units (PMU) and especially to power management units requiring pulse width modulation controllers. Such PMU's are in common usage in many devices, but especially in mobile devices such as mobile phones, smartphones, tablet computers and other similar communication and data processing devices.

BACKGROUND OF THE INVENTION

Mobiles devices imply high constraints in the embedded power management unit. Typically, these power management units are comprised of buck convertors which are synchronized by a main clock phased by a pulse width modulated (PWM) control. FIG. 1 illustrates such a conventional architecture.

The main clock 1 (CLK) is phase shifted by the blocks 2, 3, 4 (PH1, PH2, PH3). Each of these blocks shifts the clock phase by a different value so as to produce 3 different clocks, CLK_1, CLK_2, CLK_3. Each of these clocks drives a respective one of the buck convertors 5, 6, 7, respectively BUCK1, BUCK2, BUCK3. In the basic example of the FIG. 1, only 3 bucks 5, 6, 7 are depicted. The blocks PH1, PH2, PH3 can thus force a 60° phase shift between the clocks. For instance:

The clock CLK_1 may not be shifted with regard to the main clock CLK.
The clock CLK_2 may be shifted by +60°, with regard to the main clock CLK.
The clock CLK_3 may be shifted by +120° with regard to the main clock CLK.

In general where N is the number of buck convertors, the clock CLK_i driving the buck convertor BUCK_i may be shifted by 360×i/N, where i∈[0, N−1]. This architecture prevents all the buck convertors starting their conduction cycle on the same clock rising edge, which would lead to a large undershoot on the battery. For this reason, the buck convertors are often referred to as PWM synchronized voltage mode control.

FIG. 2 shows a high level block diagram of a standard synchronized PWM voltage mode control DC/DC architecture. The output voltage Vout is compared with the reference voltage Vref and amplified by a compensation network made of resistors Z1, Z2, capacitor c and an amplifier (Amp). The passive elements Z1, Z2 are dedicated to the stabilization of a global loop. At the output of the amplifier (Amp), the signal Verror is compared to an internal ramp (Vramp), which is synchronized to the rising edge of the clock signal.

At the beginning of the clock signal, the state machine SM operates a latch L1 to power PMOS 8 on to conduct the clock signal will synchronously keep the NMOS 9 non-conducting (off). Each time the error signal Verror crosses the Vramp signal, the state machine turns the PMOS 8 off and switches a latch L2 to power on an NMOS 9 to the conducting state. The end of the NMOS conduction cycle is set by the signal Vx at the end of the clock cycle. This is further illustrated by the FIG. 3 which shows the time lines for, from top to bottom, the clock 10, the signal Vx 11, the ramp Vramp 12 and the error signal Verror 13, and the output of the PMOS and NMOS, respectively CMD_P 14 and CMD_N 15.

An important drawback of this architecture is that in case of high output load transients, the output voltage undershoots. The load transient performance is dependent not only on the output filters L and C but also on the phase difference between (ΔTd) the output load transient step and the clock rising edge. Due to the dependence on the phase difference between the output load transient step and the clock rising edge, the load transient performance can be impacted by 30%.

High output load transients are more and more a requirement from the market. There is therefore a need for a technical solution which will reduce the impact on the performance of high output load transients.

STATEMENT OF INVENTION

Accordingly the present invention provides a pulse width modulation (PWM) controller having synchronized PWM voltage mode control architecture comprising:
means for detecting a transient load and
means for asynchronously changing the state of the state machine.

The PWM preferably reduces the phase difference between the output load transient step and the clock rising edge in order to minimize or prevent output voltage undershoot. Preferably this is achieved by applying the output of an amplifier of the PWM to a transient load detection means provided by a transient load detection circuit. The transient load detection circuit may comprise a MOSFET or transistor with similar performance, having a gate terminal to which an error voltage signal output by the amplifier is applied to generate a detection signal at the drain terminal.

The detection signal may be applied to a delaying circuit. The delaying circuit is preferably responsive to a rapidly changing detection signal to generate signals to control the conduction states of each of a PMOS transistor and an NMOS transistor. The signals may be latch signals to actuate latches controlling each respective PMOS and NMOS transistor. The delaying circuit generates each latch signal at relatively different times, i.e. the delaying circuit provides the means for asynchronously changing the state of the state machine.

To minimise ΔTd the source of the MOSFET is connected to a load/source resistor in parallel with a capacitor. This minimizes current at the source and drain during steady state operation when the capacitor is does not conduct. However, under rapid transition the capacitor acts as if to short across the resistance to induce a detection signal with much reduced phase lag at the MOSFET drain terminal. The delaying circuit responds nearly instantaneously to the detection signal to induce the asynchronous conduction state switching of the PMOS and NMOS transistors.

BRIEF DESCRIPTION OF THE DRAWINGS

A PMU and a method of operation of a PMU embodying the invention will now be described, by way of example only, with reference to the accompanying illustrative figures, in which:

FIGS. 8*a*, 8*b* and 8*c* show respectively the detection signal S, the Verror signal and the output signal Vout.

DETAILED DESCRIPTION OF EMBODIMENTS OF THE INVENTION

Figure 1:
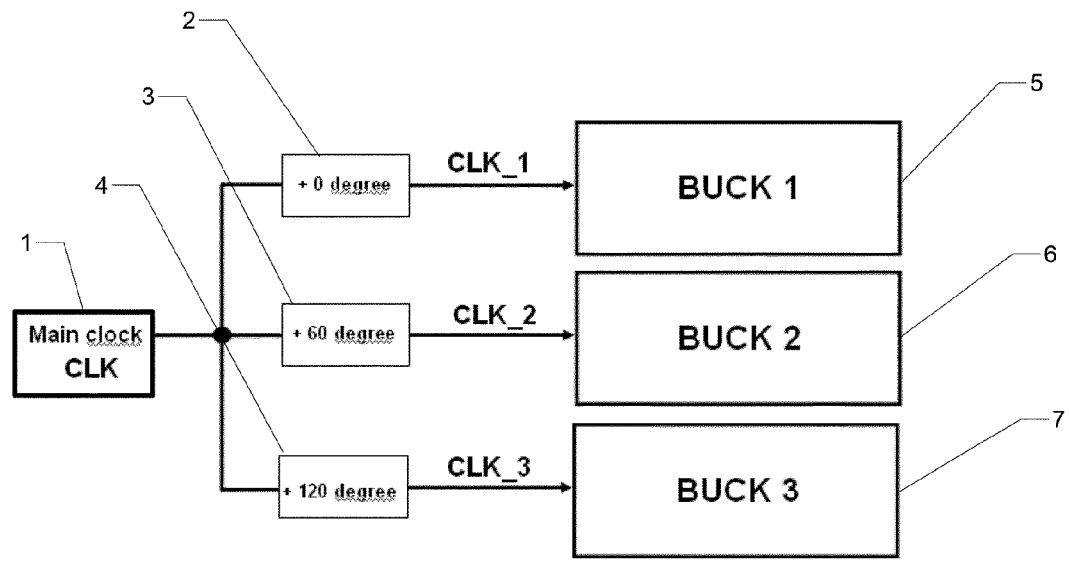
FIG. 1 illustrates a conventional power management unit.
Figure 2:
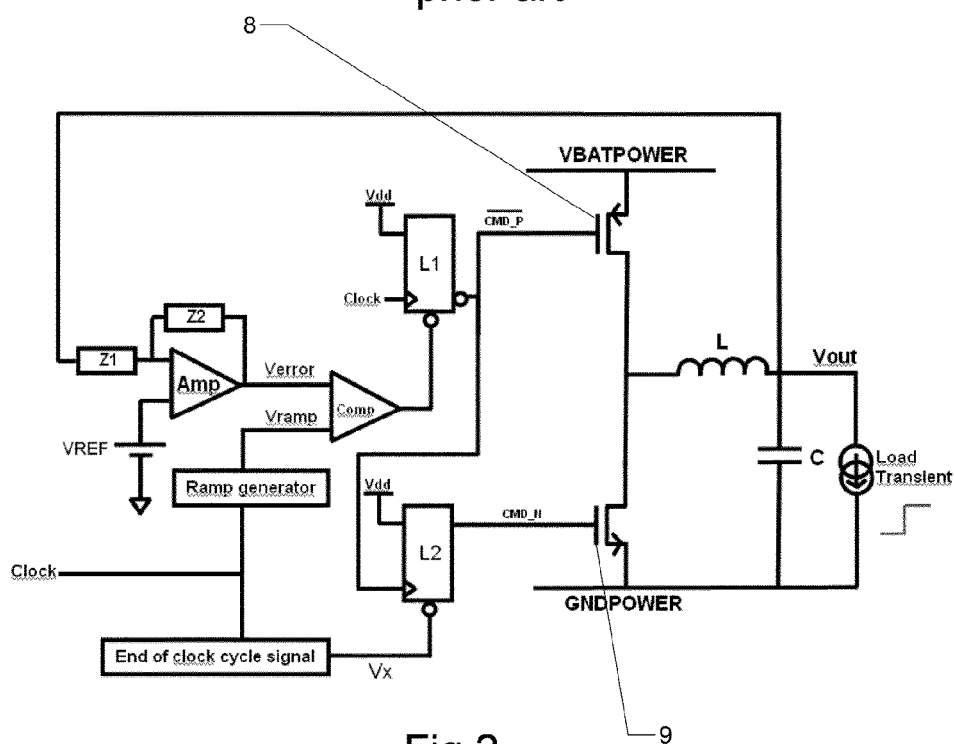
FIG. 2 shows a synchronized PWM voltage mode control DC/DC architecture.
Figure 3:
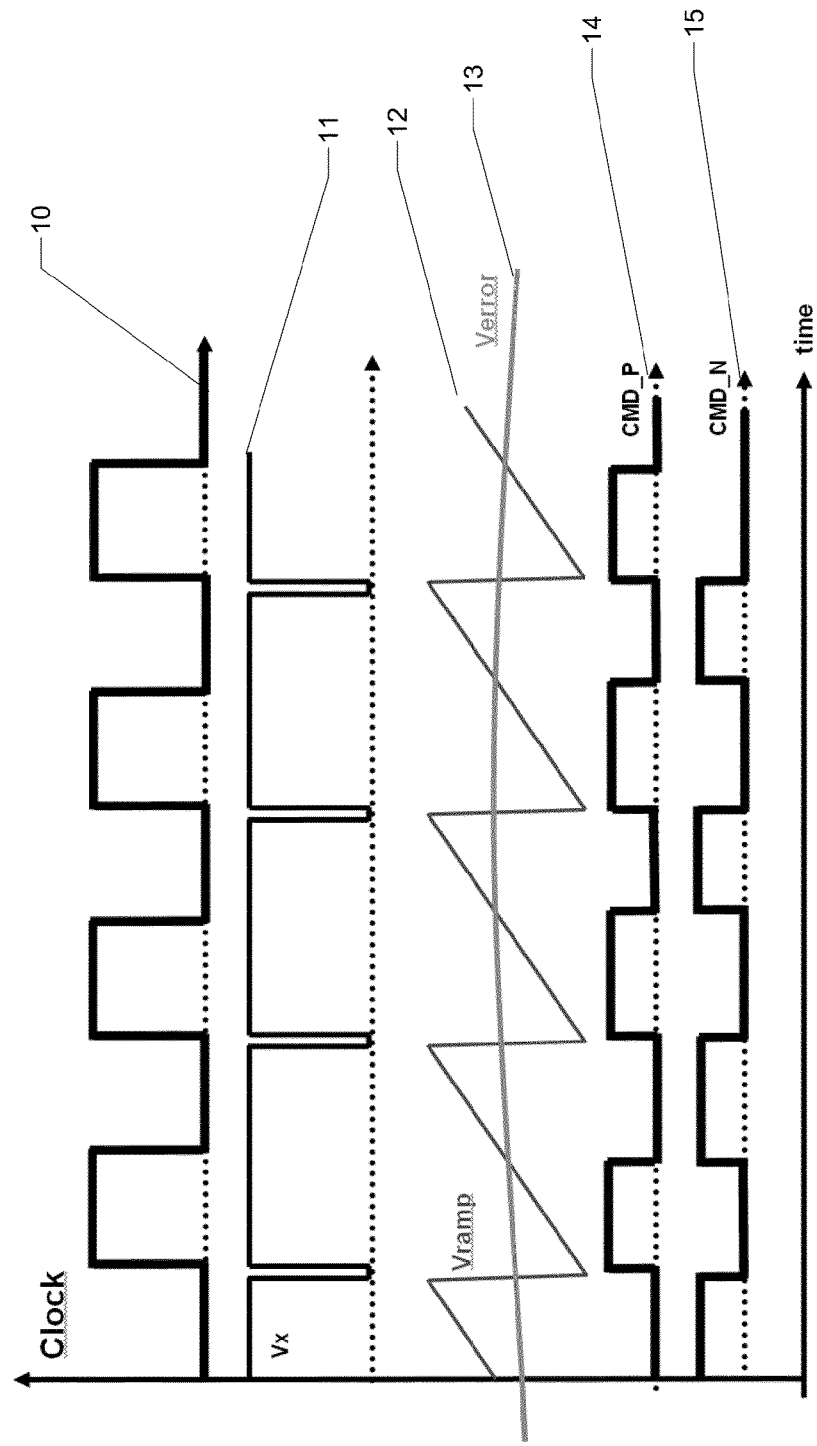
FIG. 3 depicts various signals associated with circuit elements of FIG. 2.
Figure 4A:
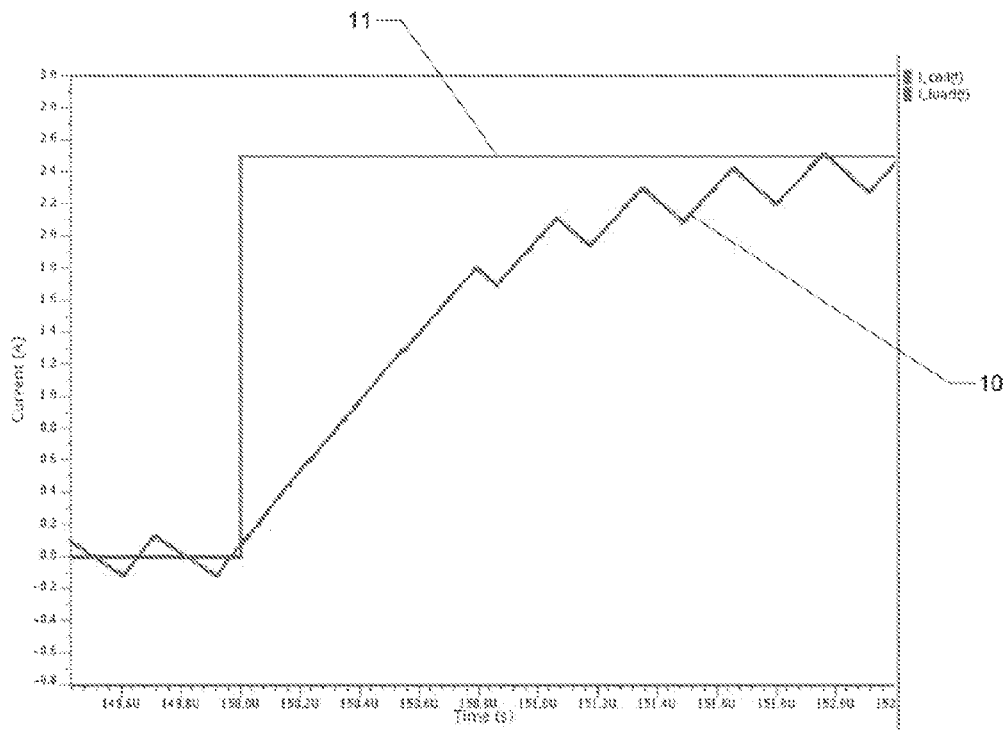
FIGS. 4a and 4b illustrate the results of experiments undertaken by the inventors into the behaviour of the current traversing a coil L with regard to the load transient.

FIG. 4*a* shows the case where the load transient 10 event occurs during the PMOS conduction cycle. As soon as the load transient 10 starts to discharge the output capacitor C, and because the stress is located inside the PMOS conduction cycle, the coil current I_coil 11 instantaneously continues to increase and compensates the output capacitor discharge with a constant positive current slope. This continues until the coil current I_coil 11 reaches the load transient step I_load 10.

Figure 4B:
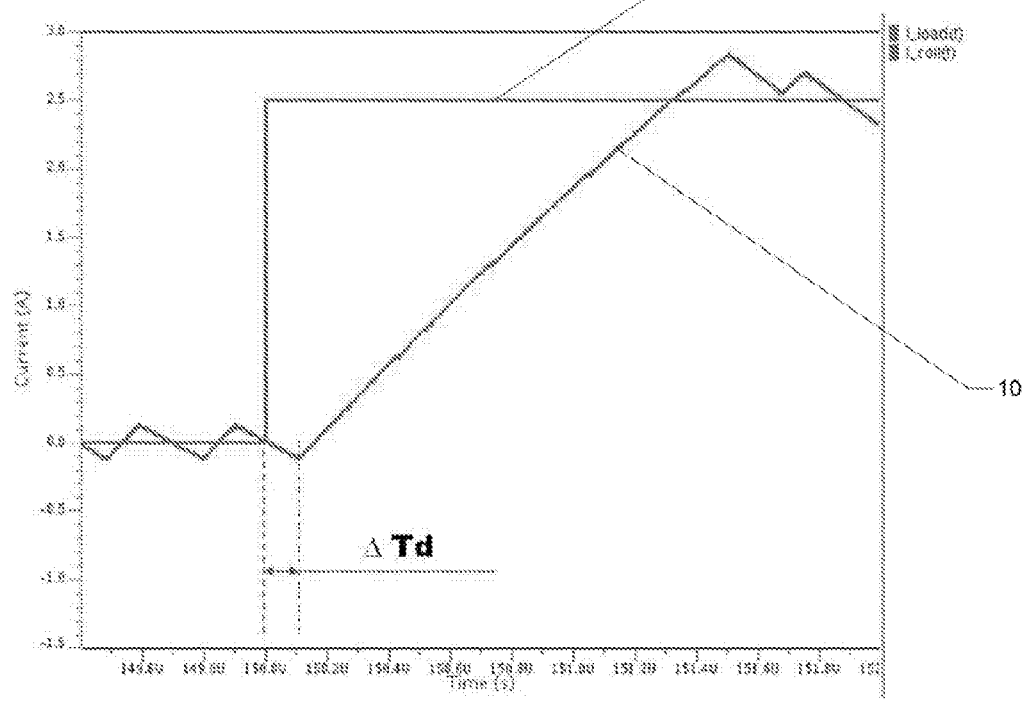

FIG. 4*b* shows the case where the load transient event occurs during the NMOS conduction cycle. Because the whole architecture is synchronized on the clock, the state machine first waits for the end of the clock cycle and then reacts to the output stress. It means that in this case the coil current I_coil 10 does not react instantaneously to the transient step of I_load. The delay ΔTd impacts the load transient performance. The more important (greater) is this delay ΔTd, the larger will be the load transients undershoot amplitude.

Figures 5A, 5B:
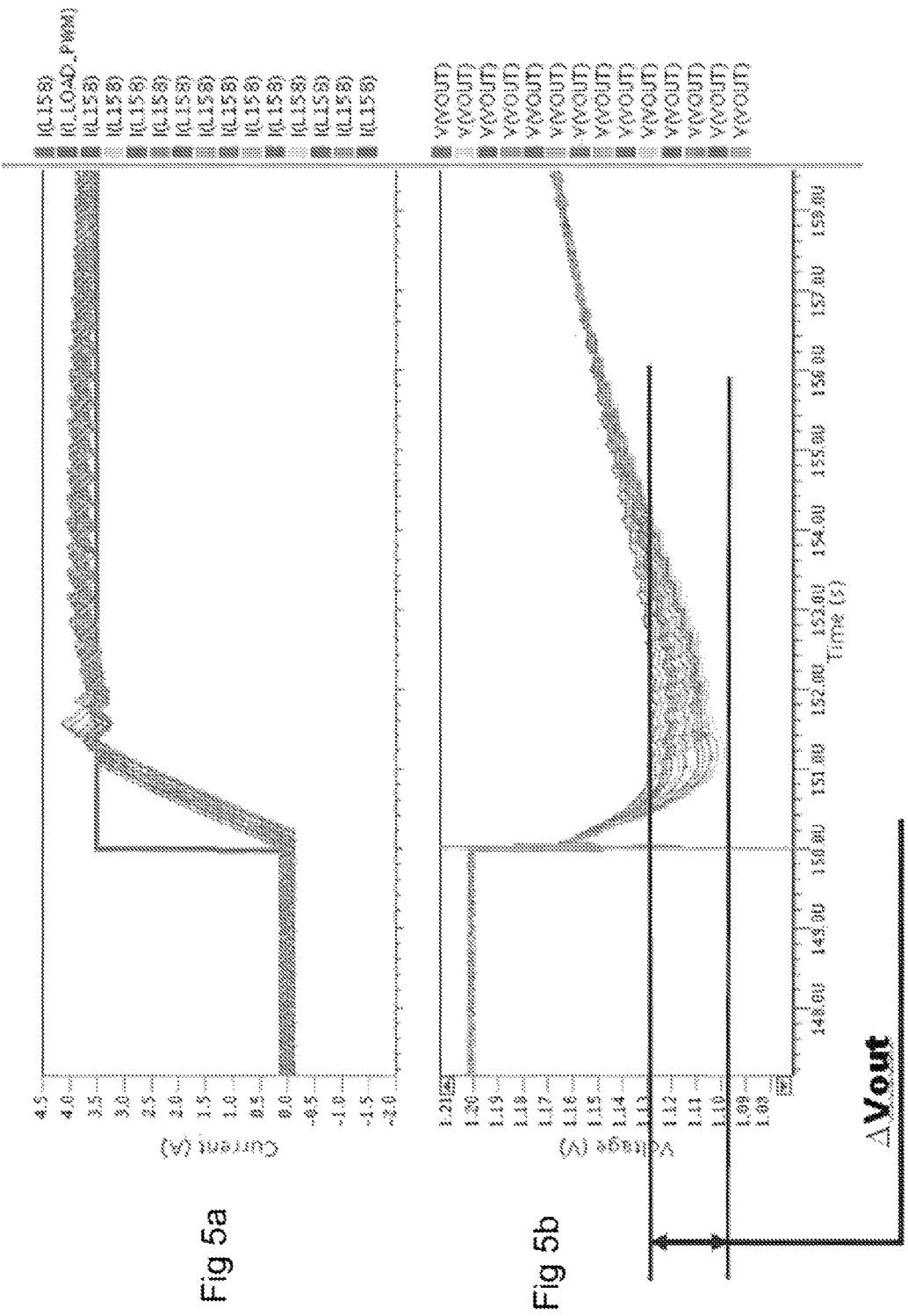
FIGS. 5*a* and 5*b* illustrates the buck load transient performance according to several values of the phase difference (ΔTd).
Figure 6:
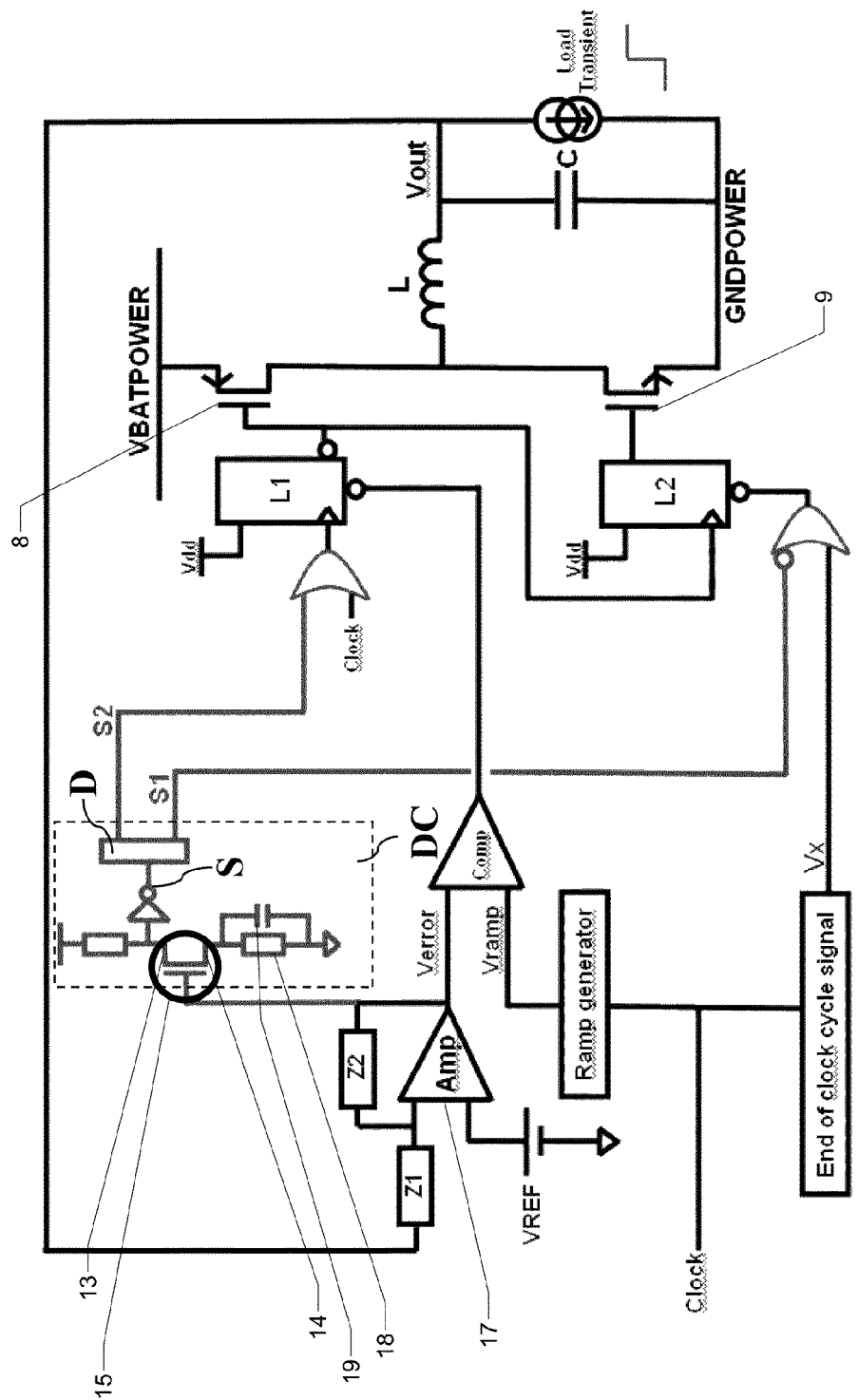
FIG. 6 illustrates a synchronized PWM voltage mode control architecture.

FIGS. 5*a* and 5*b* illustrates the buck load transient performance according to several values of the phase difference. FIG. 5*a* shows the coil current increase versus the load transient, which is delayed following the phase difference between the input buck clock and the load transient stimuli. FIG. 5*b* shows the impact of this delay on the output voltage undershoot. The value ΔVout represents the maximum dispersion of the output signal Vout. The consequence of such a delay is a dispersion that can reach 30%. According to the invention, this figure is dramatically reduced by adding to the synchronized PWM voltage mode control architecture, means for: detecting the load transient and means for asynchronously changing the state machine state. FIG. 6 illustrates such synchronized PWM voltage mode control architecture according to an embodiment of the invention.

The circuit DC enables detection of the load transient. It is based on fast change of the Verror signal. Indeed, when a fast and large load stress is applied at the output of the buck convertor, the Verror signal (measured at the output of the amplifier Amp) increases fast because of the large amplifier gain and bandwidth as a result of the output load step.

Figure 7A:
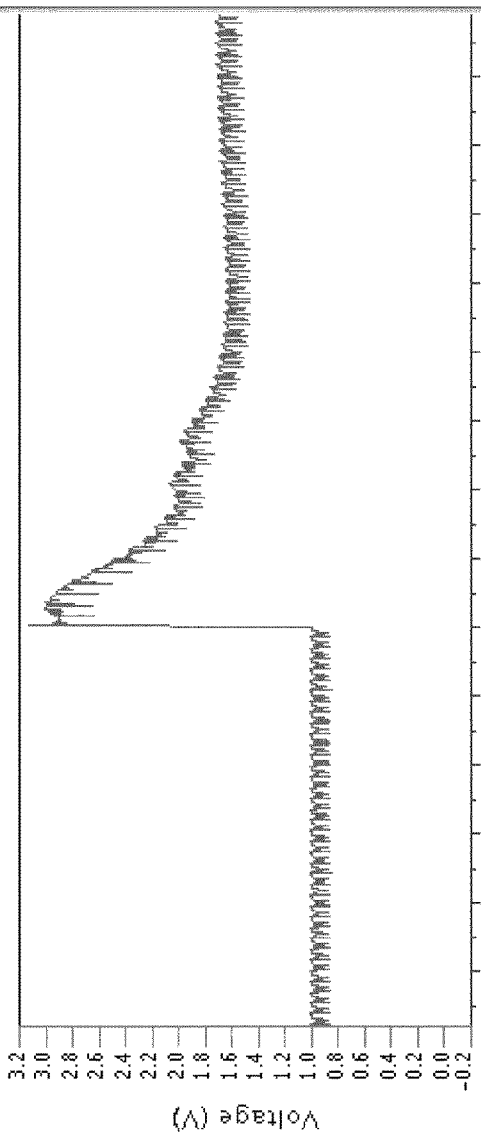
FIGS. 7*a* and 7*b* show respectively the Verror signal and the output voltage Vout.
Figure 7B:
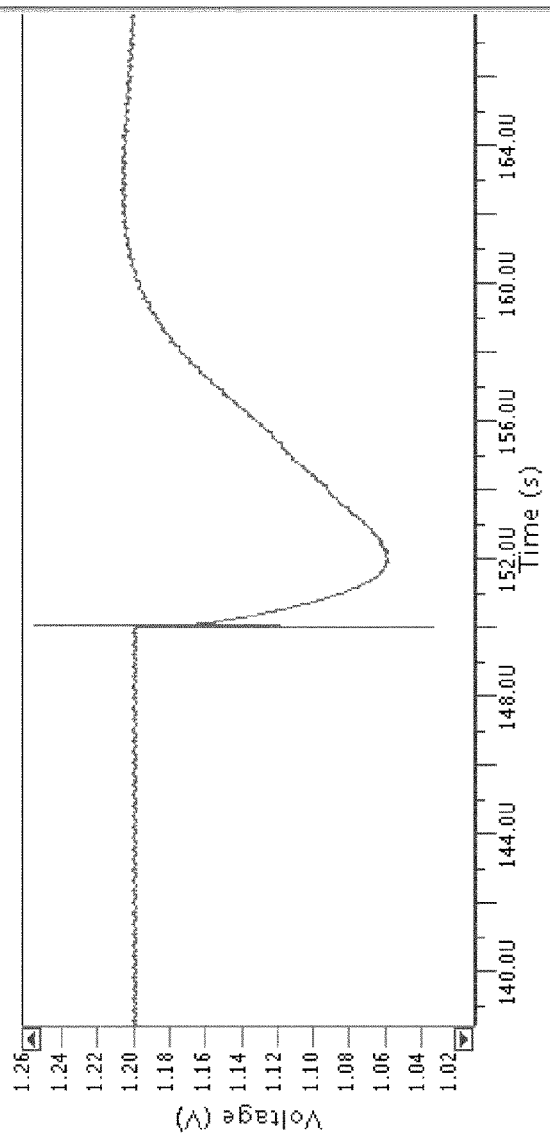

FIGS. 7*a* and 7*b* show respectively the Verror signal and the output voltage Vout. We can clearly see a quick and important increase of the Verror signal at the time of the load transient step.

Turning back to FIG. 6, when the system is stable and the output load constant, the Verror signal remains close to the reference value Vref. A source resistor 18 is made very large (for instance several Mega Ohms), e.g., between 1 and 999 MΩ, so that a very small current flows between the drain 13 and the source 14 of a MOSFET transistor 15 with its gate connected to the output of the amplifier 17 to be responsive to the error signal (Verror). The amplifier 17 is otherwise similar to the amplifier previously described with reference to the prior art architecture. For instance, the drain voltage value is around Vcc.

When the error voltage signal (Verror) increase rapidly, the source capacitor 19 conducts and causes a short circuit across the source/load resistor 18 during this fast transient event. During these few nanoseconds, a large current flows between the drain and the source. The current is large by comparison with the steady state condition. Consequently, the voltage at the drain makes a fast negative spike from Vcc and the inverted output voltage follows a very fast positive spike from zero to Vcc.

The power consumption is set mainly by the value of the load resistor 18 and can thus be kept low by keeping the source current through the load resistor below 1 μA. One of the advantages of the invention is to keep current consumption at a very low level.

FIGS. 8*a*, 8*b* and 8*c* show respectively the detection signal S, the Verror signal and the output signal Vout. As soon as the event is detected, the state machine is forced to quit the conduction cycle from the NMOS power transistor 9 and to substantially instantaneously restart a conduction cycle on the PMOS transistor 8. According to an embodiment of the invention, this can be done by:

1—Reset the latch L2 in order to stop the conduction cycle on the NMOS.

2—Start a new cycle on the PMOS transistor by changing the state of the latch L1.

Figure 9:
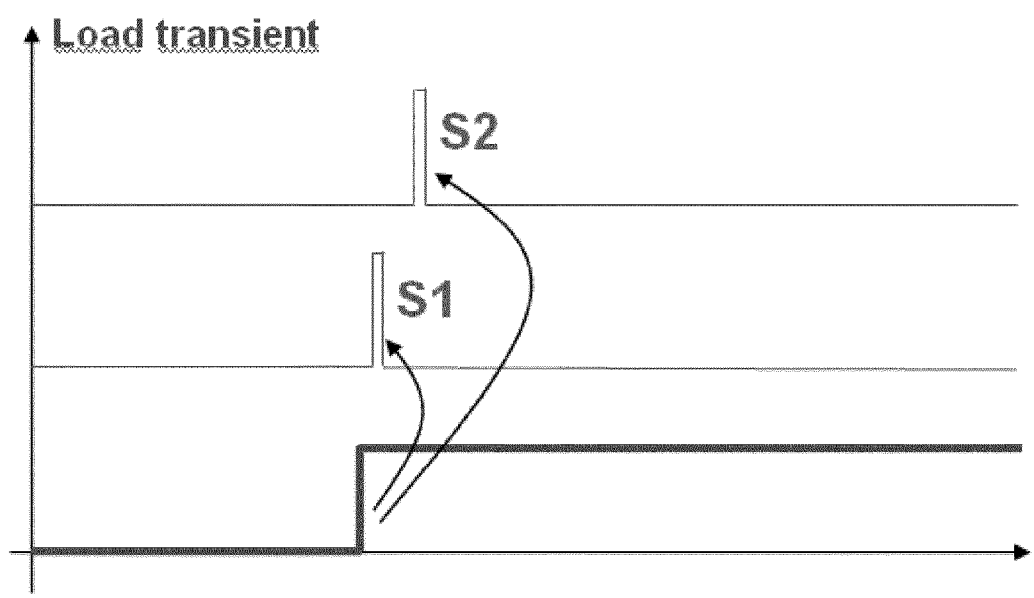
FIG. 9 shows the timing of the rectangular latch signals S1, S2 with regard to a detection signal S.

The detection signal S is applied to a delaying circuit D. The delaying circuit D generates two latch signals, S1, S2. As shown in FIG. 9, the signals S1, S2 can be rectangular signals synchronized on the step of the detection signal S. The latch signal S2 is delayed with regard to the latch signal S1, ie, the latch signals S1 and S2 are mutually asynchronous. Thanks to this arrangement, the system can detect any fast load transient at the output and avoid waiting for the next clock cycle in order to react. On the contrary, it can instantaneously react to the stress (to the extent of propagation delay). The delay ΔTd is reduced to a few nanoseconds only.

Various simulations have showed that the load transient performance is improved by 10% to 20%.

The invention claimed is:

1. A PWM controller, comprising:
an amplifier having an output that provides an error signal;
a transient load detection circuit, which comprises
a transistor having a gate communicating with the amplifier output to be responsive to the error signal, a drain that produces a detection signal, and a source terminal, and
a source resistance in parallel with a source capacitor connected to the source terminal whereby, in steady state operation all current flows through the source resistance and when the detection signal is rapidly changing the rapid voltage change at the source induces a current flow across the source capacitor to short circuit the source resistance; and
a delaying circuit connected to the drain of the transistor to receive the detection signal, wherein the delaying circuit is responsive to the detection signal to generate first and second latch signals, which are applied, respectively to a PMOS latch and an NMOS latch, said PMOS latch and said NMOS latch being connected to, respectively, a PMOS transistor and an NMOS transistor whereby, in response to said first and second latch signals a respective conduction state of the PMOS transistor and the NMOS transistor are switched.

2. A PWM controller according to claim 1, wherein a value of the source resistance is of the order of 1-999 MΩ.

3. A PWM controller according to claim 1, wherein the detection circuit is arranged to generate rectangular latch signals synchronized on a step of the detection signal.

4. A PWM controller according to claim 3, wherein the transient load detection circuit is arranged to delay generation of one of the first and second latch signals with regard to the other of the first and second latch signal to asynchronously change the respective conduction state of the PMOS and NMOS transistors.

5. A PWM controller according to claim 1, further comprising:
a comparator coupled to the amplifier output to receive the error signal, compare the error signal to a signal from a ramp generator, and output a signal to the PMOS latch based on the comparison.

6. A PWM controller according to claim 1, wherein the delay circuit is coupled to a clock input of the PMOS latch.

7. A PWM controller according to claim 6, wherein an output of the PMOS latch is coupled to a clock input of the NMOS latch.

8. A PWM controller according to claim 1, wherein a first input of the amplifier is coupled to a voltage reference an a second input of the amplifier is coupled to an output of the PWM controller.

* * * * *